(12) United States Patent
AbuGhazaleh et al.

(10) Patent No.: US 7,057,899 B2
(45) Date of Patent: Jun. 6, 2006

(54) MIDSPAN PATCH PANEL WITH CIRCUIT SEPARATION FOR DATA TERMINAL EQUIPMENT, POWER INSERTION AND DATA COLLECTION

(75) Inventors: Shadi A. AbuGhazaleh, Oakdale, CT (US); Robert C. Baxter, Warwick, RI (US); Rehan Mahmood, Lebanon, CT (US); Alan C. Miller, Madison, CT (US); Michael R. O'Connor, Seymour, CT (US)

(73) Assignee: Hubbell Incorporated, Orange, CT (US)

( * ) Notice: Subject to any disclaimer, the term of this patent is extended or adjusted under 35 U.S.C. 154(b) by 0 days.

(21) Appl. No.: 11/038,460

(22) Filed: Jan. 21, 2005

(65) Prior Publication Data

US 2005/0201071 A1     Sep. 15, 2005

Related U.S. Application Data

(63) Continuation-in-part of application No. 10/791,291, filed on Mar. 3, 2004, now abandoned.

(51) Int. Cl.
*H05K 7/10* (2006.01)
*H01R 24/00* (2006.01)

(52) U.S. Cl. .............. 361/780; 361/788; 439/676; 439/941

(58) Field of Classification Search ................ None
See application file for complete search history.

(56) References Cited

U.S. PATENT DOCUMENTS

| | | | |
|---|---|---|---|
| 2,189,993 A | 2/1940 | Ramsey | |
| 4,654,640 A | 3/1987 | Carll et al. | 340/568 |
| 4,697,858 A * | 10/1987 | Balakrishnan | 439/61 |
| 4,800,465 A | 1/1989 | Rodgers et al. | 361/432 |
| 5,406,260 A | 4/1995 | Cummings et al. | 340/568 |
| 5,546,277 A | 8/1996 | Zandbergen | 361/726 |
| 5,572,348 A | 11/1996 | Carlson et al. | 359/125 |
| 5,630,058 A | 5/1997 | Mosley et al. | 395/187.01 |
| 5,673,009 A | 9/1997 | Klas et al. | 333/1 |
| 5,748,451 A * | 5/1998 | Thompson et al. | 361/788 |
| 5,765,698 A | 6/1998 | Bullivant | 211/26 |
| 5,797,764 A | 8/1998 | Coulombe et al. | 439/55 |
| 5,875,242 A | 2/1999 | Glaser et al. | 379/207 |
| 5,921,402 A | 7/1999 | Magenheimer | 211/26 |
| 5,930,119 A * | 7/1999 | Berding | 361/788 |
| 5,931,703 A * | 8/1999 | Aekins | 439/676 |
| 5,944,535 A * | 8/1999 | Bullivant et al. | 439/49 |
| 6,057,743 A * | 5/2000 | Aekins | 333/1 |

(Continued)

FOREIGN PATENT DOCUMENTS

GB    2236398 A    4/1991

*Primary Examiner*—John B. Vigushin
(74) *Attorney, Agent, or Firm*—Mark S. Bicks; Alfred N. Goodman

(57) ABSTRACT

A compensating advanced feature patch panel that can include removable modular or fixed electronic components located directly on the patch panel which are separately or in combination capable of providing advanced features such as device detection and power insertion. The patch panel provides communications between an insulation displacement connector (IDC) at a PD/User end, and any standard interface type using unshielded twisted pair cables, such as an RJ45 connector at a switch end at performance levels of at least category 3, 5, 5e, 6 and/or higher (e.g. 6e or 7) and equivalent performance levels by compensating for the active electronics used in providing advanced features. Compensation is achieved in part through the separation and isolation of active and communication circuit elements.

28 Claims, 11 Drawing Sheets

U.S. PATENT DOCUMENTS

| | | | |
|---|---|---|---|
| 6,089,923 A * | 7/2000 | Phommachanh | 439/676 |
| 6,102,214 A | 8/2000 | Mendoza | 211/26 |
| 6,140,584 A | 10/2000 | Baldissara | 174/68.3 |
| 6,215,069 B1 | 4/2001 | Martin et al. | 174/68.3 |
| 6,218,930 B1 | 4/2001 | Katzenberg et al. | 340/310.01 |
| 6,243,510 B1 | 6/2001 | Rauch | 385/15 |
| 6,350,148 B1 | 2/2002 | Bartolutti et al. | 439/489 |
| 6,380,484 B1 | 4/2002 | Theis et al. | 174/68.3 |
| 6,385,298 B1 | 5/2002 | Beyda et al. | 379/9 |
| 6,411,506 B1 * | 6/2002 | Hipp et al. | 361/686 |
| 6,415,022 B1 | 7/2002 | Meeske | 379/93.05 |
| 6,443,777 B1 | 9/2002 | McCurdy et al. | 439/676 |
| 6,464,541 B1 | 10/2002 | Hashim et al. | 439/676 |
| 6,483,715 B1 * | 11/2002 | Chen | 361/760 |
| 6,496,105 B1 | 12/2002 | Fisher et al. | 340/310.01 |
| 6,512,396 B1 * | 1/2003 | Berding | 326/101 |
| 6,533,618 B1 * | 3/2003 | Aekins | 439/676 |
| 2004/0073597 A1 | 4/2004 | Caveney et al. | |
| 2005/0141431 A1 | 6/2005 | Caveney et al. | |
| 2005/0159036 A1 | 7/2005 | Caveney et al. | |

\* cited by examiner

MIDSPAN PATCH PANEL WITH CIRCUIT SEPARATION FOR DATA TERMINAL EQUIPMENT, POWER INSERTION AND DATA COLLECTION

REFERENCE TO RELATED APPLICATIONS

This is a continuation-in-part of application Ser. No. 10/791,291, filed Mar. 3, 2004 now abandoned. Related subject matter is also disclosed in a U.S. patent application Ser. No. 10/791,292 of AbuGhazaleh et al., entitled "Midspan Patch Panel With Compensation Circuit For Data Terminal Equipment, Power Insertion And Data Collection", the subject matter of which is incorporated herein by reference.

FIELD OF THE INVENTION

The present invention relates to a patch panel replacement device including advanced features for providing power and data collection in association with attached network devices while providing at least category 3, 5, 5e, 6 and/or higher (e.g. 6e or 7) and equivalent performance levels as required. More particularly, the present invention relates to a patch panel printed circuit board including modular or fixed electrical components for use with providing advanced features and further including circuit separation techniques to minimize the adverse effects of electronics required for providing such advanced features.

BACKGROUND OF THE INVENTION

The convergence of telecom and datacom technologies, as well as the blurring distinction between the system side and the cabling system of networks is driving a continuous evolution of structured cabling. User expectations and dependence on local area network (LAN) performance is creating an expectation beyond operational speed and reliability to further include device tracking and system management. Currently, limited progress has been made in such areas due to the impact of proposed improvements upon operational speed. As hubs and switches deal in logical addresses and network maps, asset location and connection management is best addressed through the cabling system. Development of advancements must address several evolving system features and requirements such as the detection of connected devices, including the addition, removal and/or movement of such devices accessing the system and the provision of power to connected devices.

The movement of devices accessing the system is one of several considerations during improvement developments. As described in U.S. Pat. No. 6,350,148, issued Feb. 26, 2002, to Batolutti et al., the subject matter of which is incorporated herein by reference, many businesses have dedicated telecommunication systems that enable computers, telephones, facsimile machines and the like to communicate with each other through a private network, and communicate with remote locations via a telecommunications service provider. In most buildings, the dedicated telecommunications system is hard wired using telecommunication cables that are coupled to individual service ports throughout the building. The wires from the dedicated service ports typically extend throughout the building and terminate at a patching system that is used to interconnect the various telecommunication lines. The patching system is usually located within a telecommunications closet and is most often positioned on a mounting frame that includes a number of racks or patch panels to which each telecommunication line is terminated. The patch panels include a number of port assemblies, such as RJ-45 telecommunication connector ports, and each telecommunication line is terminated to the patch panel in an organized manner.

One example of device movement considerations as disclosed in the Batolutti patent includes assigning one or more employees their own computer network access number exchange so that the employee can interface with a company main frame computer or computer network. As employees or equipment are moved, patch cords in a typical telecommunications closet are rearranged and new positions are manually documented using either paper or computer based logs. However, technicians often neglect to update the arrangement log each time a change is made. To correct this, manual tracing of the patch cord must be performed which can be both time consuming and prone to further errors.

Detecting connected devices is another consideration during improvement development which is commonly required for security purposes in many applications. Details of several examples of such detection issues are disclosed in U.S. Pat. No. 5,406,260, issued Apr. 11, 1995, to Cummings et al., the subject matter of which is incorporated herein by reference. A number of device detection methods have been developed for guarding against the unauthorized removal of electronic equipment, including methods that require the actual physical attachment of a security cord to each piece of protected equipment or the attachment of non-removal tags to the equipment. However, these methods require rather expensive sensing devices and are not very practical in all cases. In the device detection method disclosed in the Cummings patent, an isolation power supply is used to provide a low current DC power signal to each communication link and thereafter, monitor a circuit loop created through a DC resistive termination between the communication link and a remote device. Any interruption between the communication link and the remote device, such as the removal of the device from the communication link, disrupts the circuit loop and triggers an alarm.

Additional methods of circuit loop device detection also include the sensing of a current loop that is physically coupled to the protected equipment. One such method is disclosed in U.S. Pat. No. 4,654,640, issued Mar. 31, 1987, to Carll et al., the subject matter of which is incorporated herein by reference. The Carll patent discloses a theft alarm system for use with a digital signal PBX telephone system which includes a number of electronic tethers connected to individual pieces of protected equipment, each tether including a pair of conductors which are connected to form a closed current loop via a series resistor and conductive foil adhesively bonded to the equipment. Once assembled, the resulting circuit loop can be used for device removal detection, however, the conductive foil which is bonded to the equipment may be carefully removed without any detection.

The Batolutti patent also referenced above, discloses yet another method of detection for patch panel connectors themselves. A patch panel on which multiple mechanical sensors are mounted, serves to detect the presence or absence of a patch cord connector in a connector port on the panel and a computer controller connected to the multiple sensors may then be used to monitor changes in patch panel connections, such as when a connector is removed from a connector port. The detection, however, is limited to the mere absence or presence of a connector in a connector port.

Providing power to connected devices is yet another consideration during improvement development which can often include aspects of device detection as described above.

Power applications, such as those found in power over ethernet technologies, allows IP telephones, wireless LAN Access Points and other appliances to receive power while also receiving data over existing LAN cabling without a need to modify ethernet infrastructure. Such technologies are described in IEEE802.3af, also known as Power Over Ethernet, which outlines the designs of Ethernet power-sourcing equipment and powered terminals.

Various methods for providing power to remote devices are also disclosed in U.S. Pat. No. 6,218,930, issued Apr. 17, 2001, to Katzenberg et al., the subject matter of which is incorporated herein by reference. In one example of a power application technology, an initial detection step is used prior to a power application step. Prior to applying external power to a device, automatic detection of connected equipment is accomplished by delivering a low level current to the network interface and measuring a voltage drop in the return path. The measurement can have three states, including no voltage drop, a fixed level voltage drop or a varying level voltage drop. As disclosed in the Katzenberg patent, if no voltage drop is detected, then the remote equipment does not contain a DC resistive termination and this equipment is identified as unable to support remote power feed. If a fixed voltage level is detected, the remote equipment contains a DC resistive termination, such as a "bob smith" termination and this equipment is also identified as being unable to support remote power feed. If a varying voltage level is detected, this detection indicates the presence of a DC-DC switching supply in the remote equipment and this equipment is identified as being able to support remote power feed which is then provided.

The attempts to address device movement and detection, as well as attempts to address providing power to connected devices, typically fail to consider the communication performance degradation that such solutions can create. Where attempts to correct performance degradation have been made, the solutions have typically been limited to the relocation and manipulation of signal traces. Examples of such solutions are disclosed in U.S. Pat. No. 5,797,764, issued Aug. 25, 1998, to Coulombe et al., and in U.S. Pat. No. 5,673,009, issued Sep. 30, 1997, to Klas et al., the subject matter of each being incorporated herein by reference. The Coulombe patent discloses a printed circuit board electrically coupling a connector block and jack assembly within a patch panel. Each signal trace on the board is provided a compensation trace aligned either above or below the respective signal trace for an electromagnetic connection between traces sufficient to reduce crosstalk. Trace manipulation is also disclosed in the Klas patent, which discusses a printed circuit board on which crosstalk is eliminated through the relocation of adjacent traces. Equal and opposite signal source traces are placed adjacent to one another such that cumulative crosstalk is eliminated. Unfortunately, trace manipulation is not sufficient in every case to provide category 3, 5, 5e, 6 and/or higher and equivalent performance levels.

Still further examples of such solutions are disclosed in U.S. Pat. No. 6,443,777, issued Sep. 3, 2002, to McCurdy et al., and in U.S. Pat. No. 6,464,541, issued Oct. 15, 2002, to Hashim et al., the subject matter of each being incorporated herein by reference. The McCurdy patent discloses an inductive and capacitive crosstalk compensation technique incorporated into a communication connector (i.e. modular jack) which includes the relocation of contact wires and the addition of a printed wiring board for capacitive coupling. The contact wires are separated by a distance set to obtain an adequate level of inductive compensation coupling, and a capacitive coupling is provided by one or more printed circuit boards located in the plug body as the contact wires are displaced. The use of such printed wiring boards is also discussed in the Hashim patent, which discloses a two stage crosstalk compensation technique. In a first stage, a printed wiring board is provided for capacitive coupling as the contact wires are displaced, and in a second stage, a printed wiring board is provided having a number of inductive loops and carefully positioned comb traces. Although both the McCurdy and Hashim patents address crosstalk reductions at the connector position, each fails to address the performance degradation beyond the connector, including performance degradation that can be created due to additional active circuitry elements involved in providing advanced features.

Accordingly, a need exists for an asset aware patch panel that can include advanced features for asset management and security, and can also provide compensation for active electronics used in achieving these and other advanced features.

SUMMARY OF THE INVENTION

An object of the present invention is to provide a system and method for an asset aware patch panel circuit that can include advanced feature components for use with asset management and security functions, including functions for providing power and detection for remotely connected devices.

Another object of the present invention is to provide a system and method for an asset aware patch panel circuit that can provide advanced feature components as either removable modular electronic components or as fixed electronic components located directly on a patch panel printed circuit board.

Another object of the present invention is to provide a system and method for an asset aware patch panel circuit that can provide communication between an insulation displacement connector (IDC) at a PD/User end and any standard interface type using twisted pair cables, such as an RJ45 connector, at a switch end (i.e. telecommunication equipment end).

A further object of the present invention is to provide a system and method for an asset aware patch panel circuit that can minimize the adverse performance effects on communication created by removable modular or fixed electronic advanced feature components and provide at least category 3, 5, 5e, 6 and/or higher (e.g. 6e or 7) and equivalent performance levels as required.

Yet another object of the present invention is to provide a system and method for an asset aware patch panel circuit constructed as a 3U panel which includes space for cable management and active circuitry between telecommunication circuits arranged above and below the cable management and active circuitry, including 1 to 120 ports per unit such that density is maintained.

These and other objects of the present invention are substantially achieved by providing an asset aware patch panel circuit that can include removable modular or fixed electronic components located directly on a patch panel printed circuit board, which are separately or in combination used in providing advanced features. The advanced features can include detecting the connection presence or absence of a remote device and where applicable, providing a power supply to connected remote devices including VoIP phones, remote wireless Ethernet devices and other network devices. The patch panel circuit includes a multilayered patch panel printed circuit board having a plurality of layers, a communication circuit disposed on a first layer and electrically coupled between an insulation displacement connector (IDC) at a PD/User end and an RJ45 connector at a switch end, and a removable modular or fixed electronic component electrically coupled with the communication circuit. The component can include an active circuit disposed on a second layer for use in providing an advanced feature. The circuit further includes a compensating separation mechanism including at least a third layer disposed between the first and second layer to isolate the active circuit from the communication circuit to substantially minimize the adverse effects resulting from the active circuit. The isolation of the active circuit can be further assured by providing the active circuitry as removable modular components, such as a dual in-line memory module (DIMM) or similar device.

The patch panel circuit and included fixed and/or removable components can support devices implementing techniques similar to those of IEEE802.3af and TIA-568B series, including updates such as TIA568B.1-6. The patch panel circuit and included components are also sufficiently flexible to provide power to other proprietary device configurations, applications or developing standards that require similar power levels.

The patch panel circuit can also perform data collection functions on various system parameters including device connections, locations and power status conditions at various connection ports. In each case, the patch panel circuit provides at least category 3, 5, 5e, 6 and/or higher (e.g. 6e or 7) and equivalent performance levels by minimizing the adverse effects of the active fixed and/or removable electronics used in providing advanced features through the use of circuit component separation techniques to compensate for advanced feature electronics.

Other objects, advantages and salient features of the present invention will become apparent from the following detailed description, which, when taken in conjunction with the annexed drawings, discloses a preferred embodiment of the present invention.

BRIEF DESCRIPTION OF THE DRAWINGS

Referring to the drawings which form a part of this disclosure.

DETAILED DESCRIPTION OF THE INVENTION

The present invention includes an electrical device which functions as a patch panel while providing additional advanced features. Where such features are provided, the present invention also serves to reduce or eliminate the adverse effects created by the additional feature electronics through positioning and separation of circuit elements, and/or providing effect minimizing or compensation circuit elements to increase performance levels.

The present invention can include one or more advanced feature components separately or in combination as either modular plug-in units, such as a dual in-line memory (DIMM), or circuits disposed directly on the patch panel circuit board. As described in greater detail below, the advanced feature components can be used to detect devices attached to the patch panel cabling, both for security and to determine the device types with respect to power requirements, and further provide DC power to attached devices where practical. Power can be provided through techniques similar to those outlined in IEEE802.3af and TIA-568B series, including updates such as TIA568B.1-6 and other developing standards.

The modular features of the present invention allows such components to be added and removed in any number of combinations to provide a wide range of desired advanced features to the patch panel, even beyond those outlined above. For example, there are several standards and applications that need power application other than IEEE802.3af, such as building automation systems, security systems, VoIP and so on, and the reference to IEEE802.3af above is presented as one example of the application of the present invention. Also, the modular features of the present invention allow for still developing standards, such as those associated with the TIA and IEEE. Additionally, separate modules can be used for providing different functions. For example, separate modules can be provided for power application and for asset management functions.

The advanced feature components, however, are not restricted to modular units and can also include fixed circuits or circuit components that are disposed directly on the patch panel or patch panel printed circuit board. In each case and specifically in cases where additional feature circuit components are disposed directly on the patch panel printed circuit board, the components can create adverse effects which require compensation if the patch panel is to achieve desired performance levels. Such compensation can be provided through techniques such as separation and selective positioning of advanced feature components and circuits, and through the addition of active circuit components to the patch panel printed circuit board.

Figure 1:
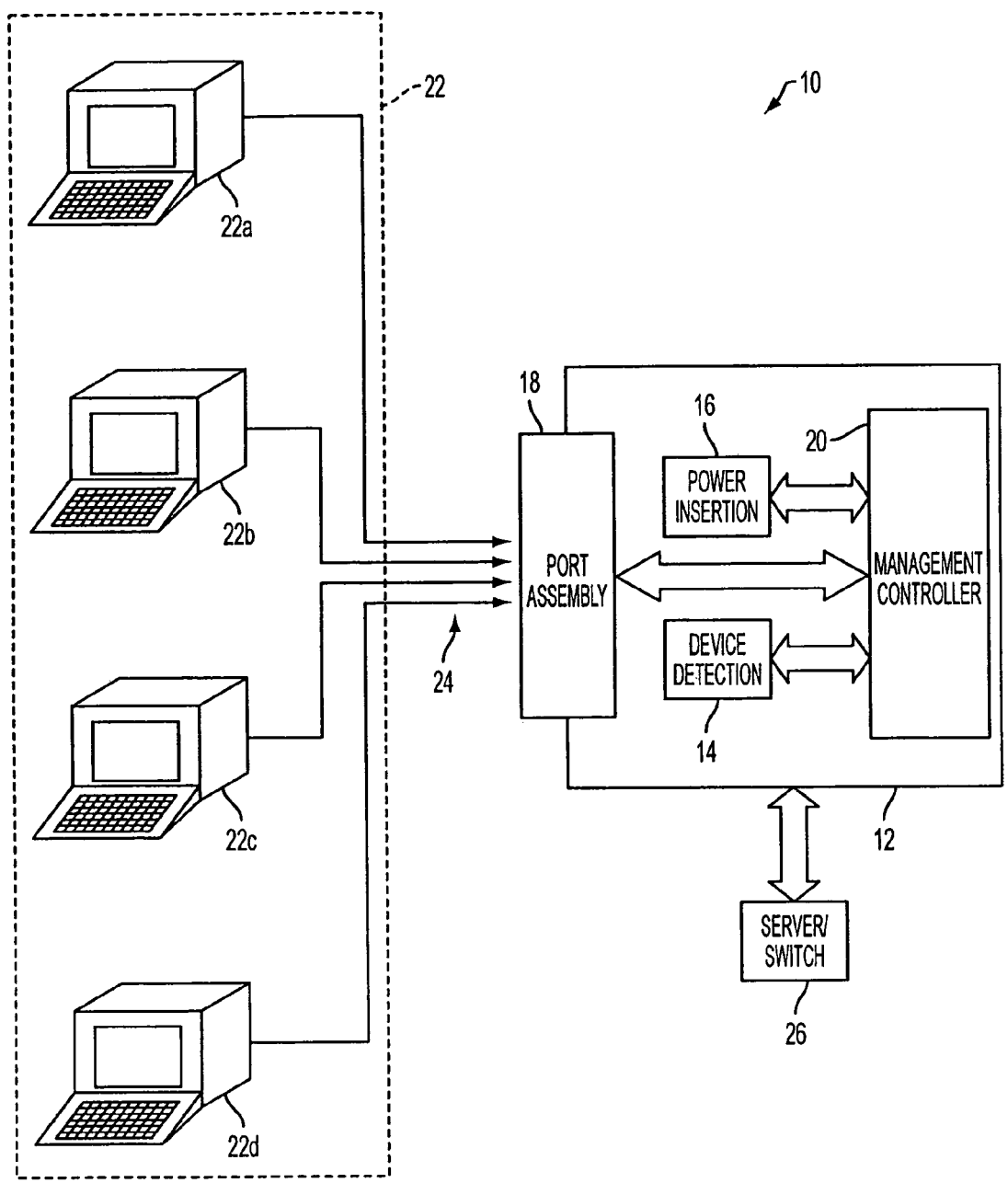
FIG. 1 is a block diagram illustrating a data terminal equipment power insertion and data collection patch panel circuit in accordance with an embodiment of the present invention.

FIG. 1 is a block diagram 10 illustrating a data terminal equipment power insertion and data collection patch panel circuit 12 which can include an optional device detection feature 14, a power insertion feature 16, a port assembly 18 and a data management feature 20 in accordance with an embodiment of the present invention. An example of a remote device network 22 is also shown, including a communication link 24 serving to electrically couple a number of remotely connected devices 22(a) through 22(d) with the patch panel circuit 12. As known to those skilled in the art, the patch panel circuit typically serves as a link or connection between such devices and a network file server or switch 26.

Each remotely located device 22(a) through 22(d) is connected to the network 26 via the patch panel 12 so as to provide widespread remote user access to a network. The remotely located devices 22(a) through 22(d) (e.g. personal computers) are shown connected to port assembly 18 via a data communication link 24 which includes a plurality of transmit and receive communication lines for communicating information between each of the remotely located devices and a final destination, such as the network file server 26.

In the embodiment of the present invention shown in FIG. 1, the patch panel 12 can be used to monitor each remotely located electronic device 22(a) through 22(d) using for example, a current loop continuity circuit provided by the device detection feature 14 as described in greater detail below. The device detection feature 14 can be provided as a removable, modular electronic component, or as a fixed circuit disposed directly on a patch panel printed circuit board of the patch panel circuit 12. In either case, the device detection feature 14 can be used to monitor the data communication link 24 and detect the presence and removal of any device from the network 22. The addition of this advanced feature however, can produce detrimental effects in the communication performance of the patch panel circuit 12.

The patch panel circuit 12 can also be used to provide power insertion for each remotely located electronic device 22(a) through 22(d) using for example, the data communication link 24. The communication link 24 allows the power insertion feature 16 of the patch panel circuit 12 to provide equipment power insertion as described in greater detail below. Additional details regarding device detection and power insertion are disclosed in U.S. Pat. No. 5,406,260 to Cummings et al., referenced above.

The patch panel circuit 12 of FIG. 1 can further include a data management feature 20 provided to monitor, control and collect data from the remote device network 22, device detection feature 14, power insertion feature 16 and any additional feature components that may be included. The information can be remotely accessed, periodically polled or provided to a network server for system management purposes. As with the device detection feature 14, the power insertion feature 16 and data management feature 20 can also be provided as separate removable, modular electronic components (e.g., DIMM or similar devices), or fixed circuits disposed directly on a patch panel printed circuit board and can also produce detrimental effects in the communication performance of the patch panel circuit 12.

The patch panel circuit 12 of FIG. 1 can be constructed as a telecommunications rack including an adapter panel, a number of patch port assemblies and one or more printed circuit boards. Each patch panel printed circuit board can be mechanically mounted to an adapter panel thereby providing a platform, or mounting surface for patch panel electronic components and additional function components.

Figure 3:
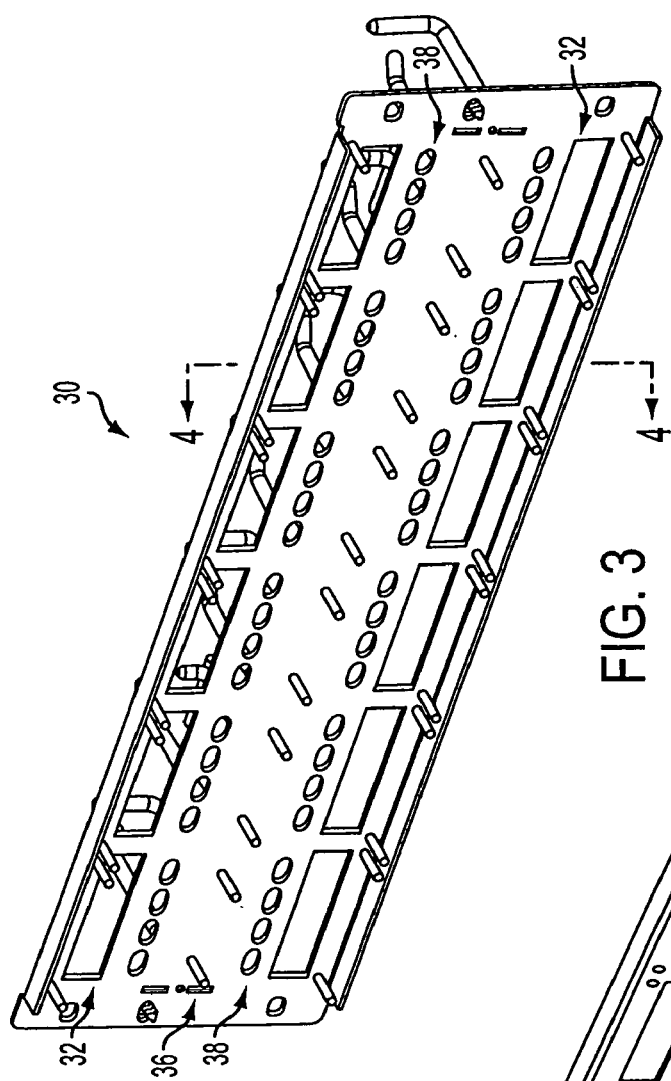
FIG. 3 is a perspective view from a second angle illustrating a mounting panel in accordance with an embodiment of the present invention.
Figure 2:
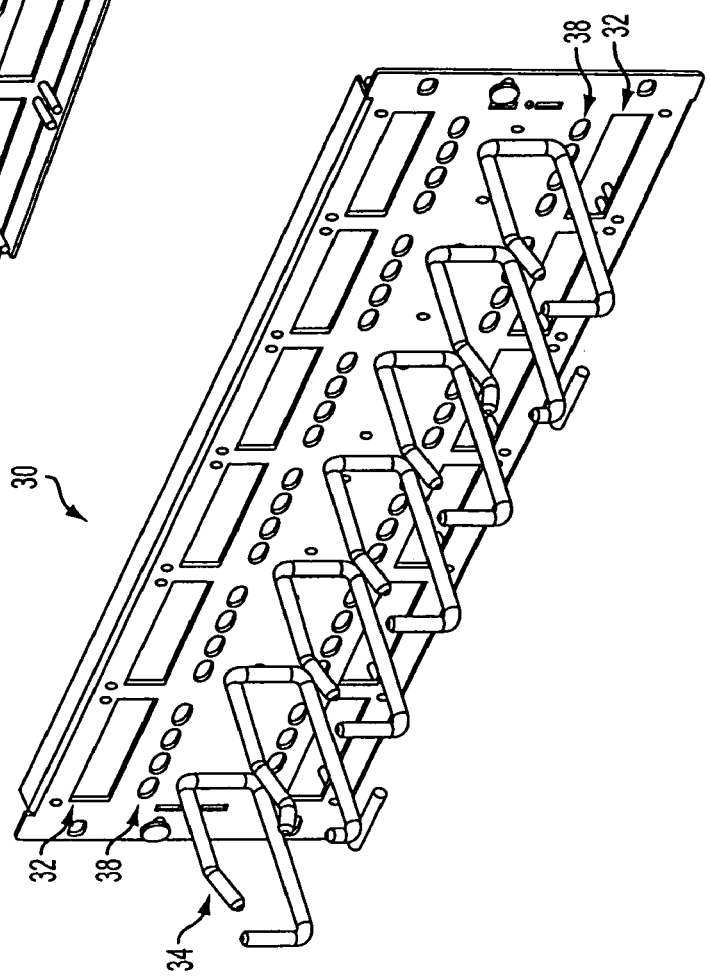
FIG. 2 is a perspective view from a first angle illustrating a mounting panel in accordance with an embodiment of the present invention.

FIGS. 2 and 3 are perspective views from a first and second angle illustrating a mounting panel in accordance with an embodiment of the present invention. FIG. 2 shows a panel 30 front surface having a series of cable management mechanisms 34 secured and extending from the panel surface between a series of port apertures 32. Between the cable management mechanisms and adjacent to each port apertures, a series of openings 38 are provided. FIG. 3 shows a panel 30 rear surface having a series of mounting mechanisms 36 secured and extending from the panel surface. Each feature of the panel shown in FIGS. 2 and 3 are described in greater detail below in association with an assembled patch panel printed circuit board and components.

Figure 4:
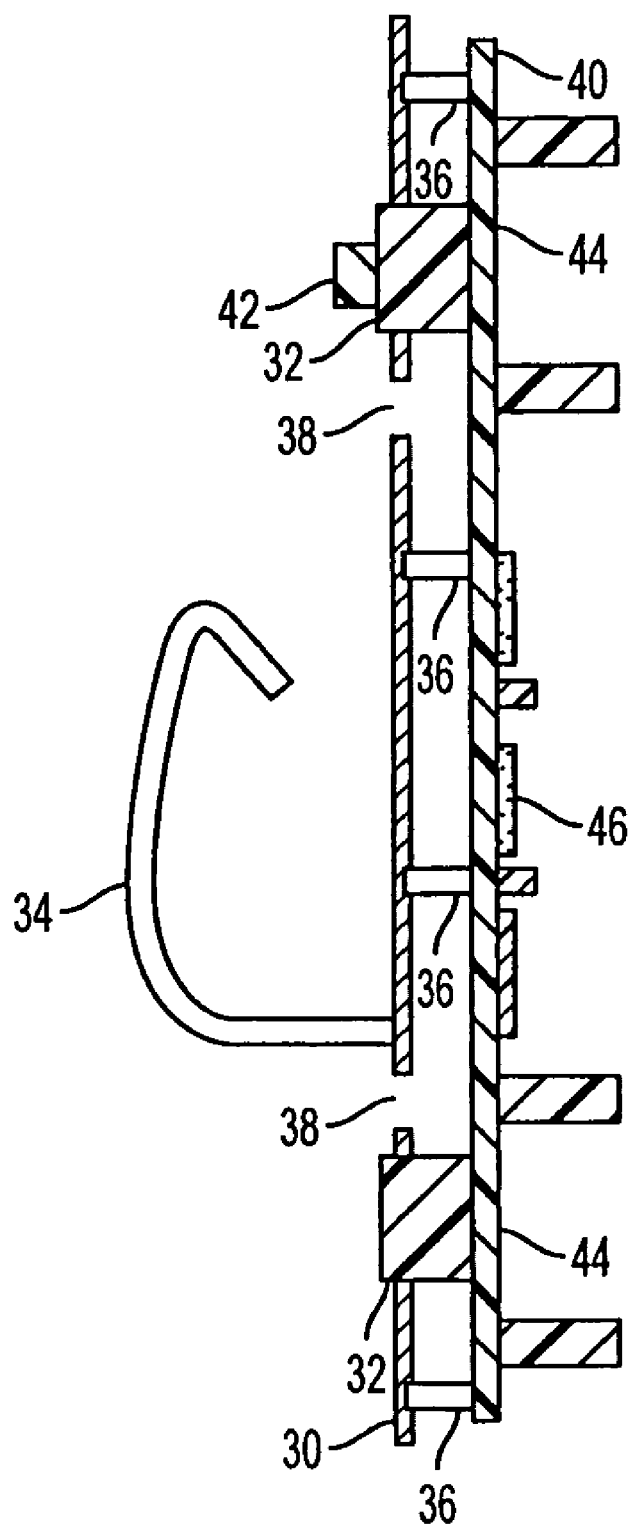
FIG. 4 is a side elevational view illustrating a patch panel assembly including advanced feature electronics in accordance with an embodiment of the present invention.
Figure 5:
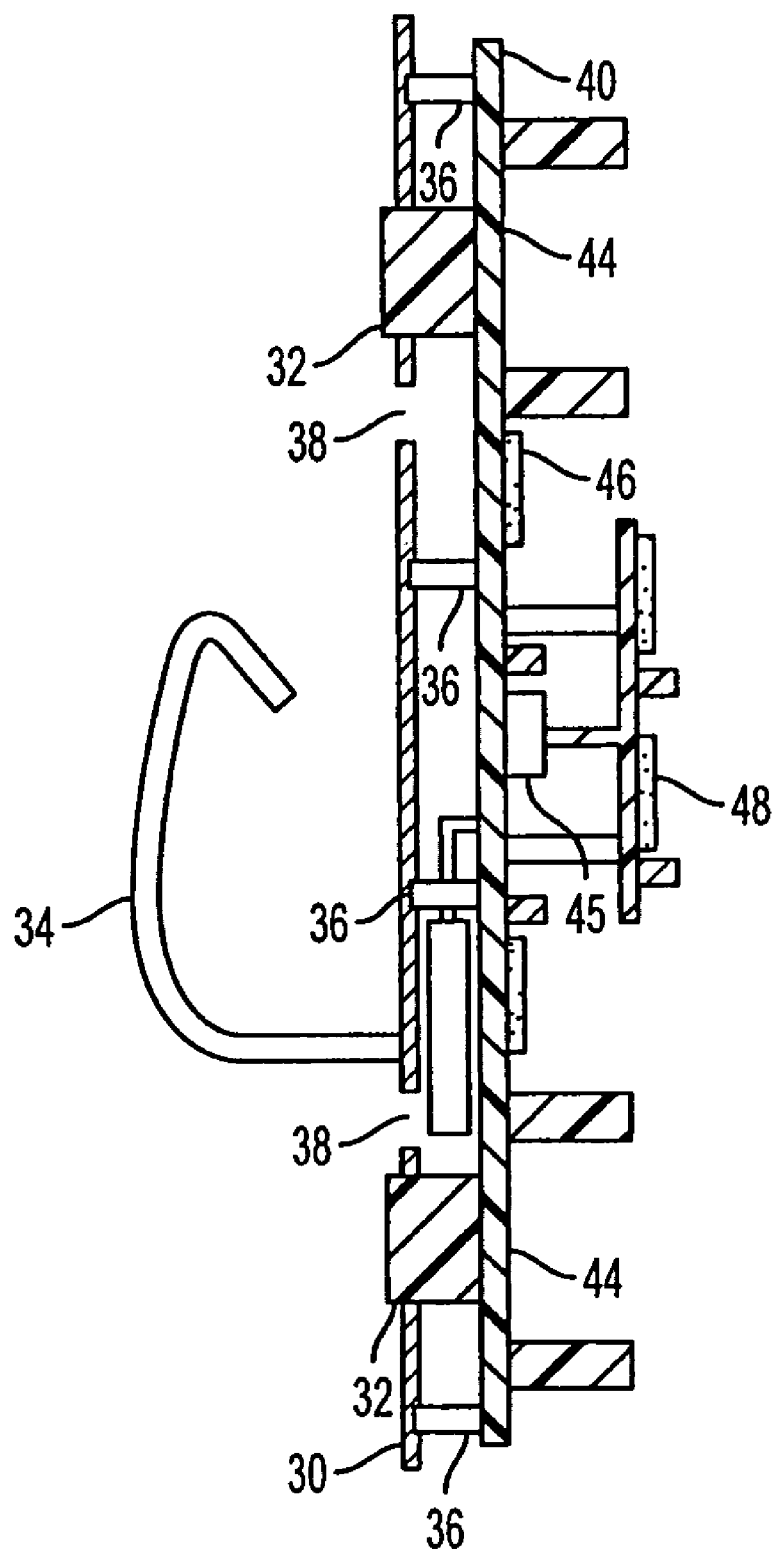
FIG. 5 is a side elevational view illustrating a patch panel assembly including advanced feature plug-in modules as a parallel mounted functionality option board in accordance with an embodiment of the present invention.
Figure 6:
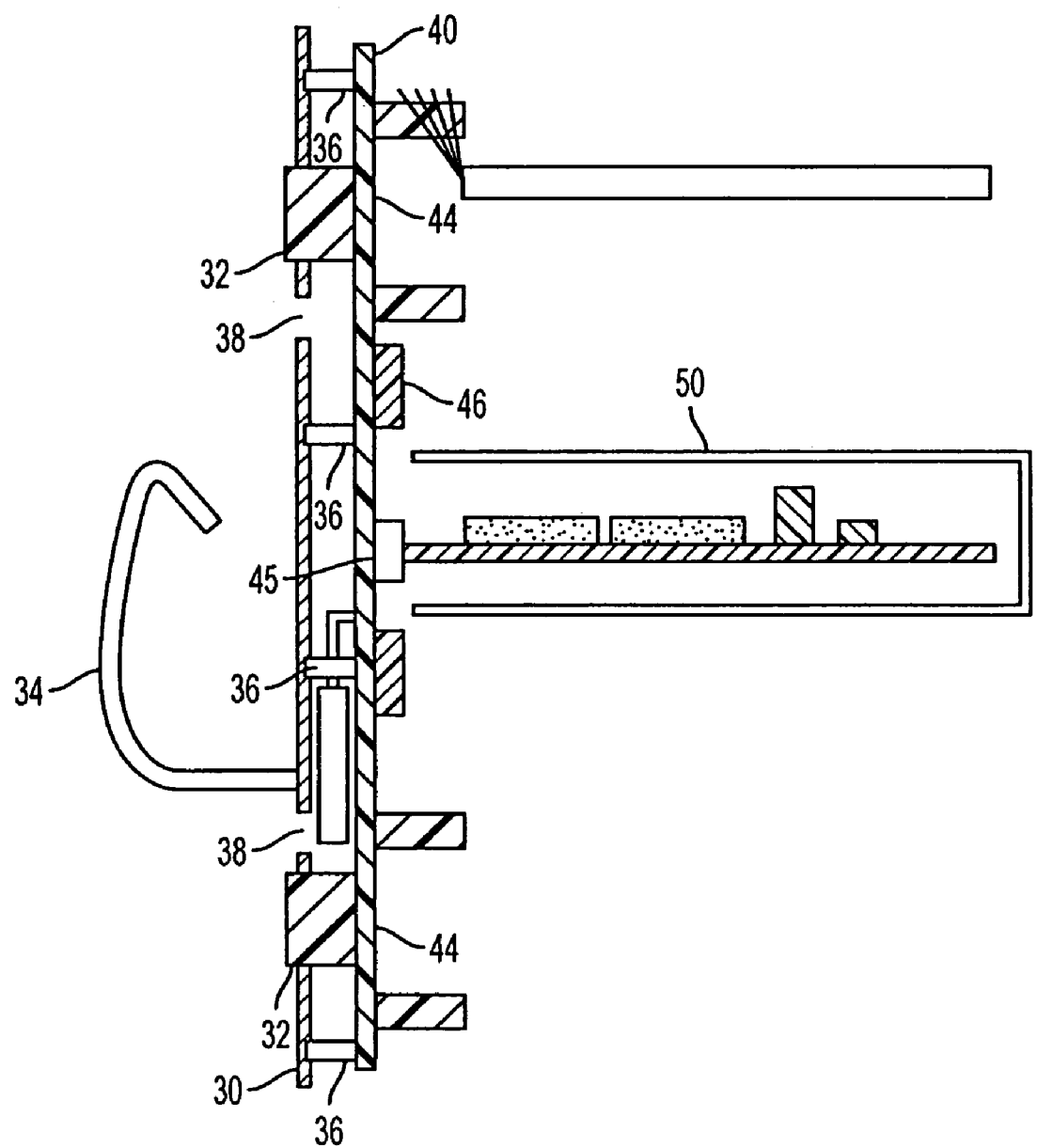
FIG. 6 is a side elevational view illustrating a patch panel assembly including advanced feature plug-in modules as a perpendicular mounted functionality option board in accordance with an embodiment of the present invention.

As noted above, the panel 30 includes a series of cable management mechanisms, port apertures, openings and mounting mechanisms, upon which a patch panel printed circuit board and associated components can be assembled and mounted as shown in FIGS. 4, 5 and 6. FIGS. 4, 5 and 6, are side elevational views illustrating an assembled telecommunications rack of patch panel circuit 12 in accordance with the present invention. As shown in FIGS. 4 through 6, the front surface of the adapter panel 30 includes a series of cable management mechanisms 34 mechanically attached adjacent to the series of port apertures 32 and can be used to provide support, control and protection for various cables associated with the patch panel circuit 12. In the example shown, the cable management mechanisms can be constructed as rings having an enclosed circumference with at least one access opening provided for cable insertion. The cable management mechanisms of FIGS. 4 through 6 are presented as one example, and may be constructed in different arrangements in yet other versions of the present invention as required by the application. The adapter panel 30 also includes a series of openings 38 between the front and rear surface of the adapter panel 30, allowing access between surfaces for use in cable routing and modular plug installations as described in greater detail below.

The rear surface of the adapter panel 30 can include one or more printed circuit boards 40 mechanically mounted via a series of mounting posts 36 extending from the rear surface of the adapter panel. The mounting posts can be constructed having a threaded inside diameter to receive a threaded connector via one or more mounting holes located on the printed circuit boards or circuit modules. One or more mounting posts 36 can also be used as an electrical ground connection between a ground plane of an attached printed circuit board and the adapter panel. In yet another version of the present invention, the mounting posts 36 can be replaced by one or more plastic support members having a snap fit or similar mechanism at each end as known to those skilled in the art.

Each mounting mechanism described above can be used to secure one or more printed circuit boards to the rear surface of the adapter panel 30 upon which both signal routing and advanced feature components can be positioned as shown in FIGS. 4 through 6.

In FIG. 4, a patch panel printed circuit board 40 is shown mounted parallel to the rear surface of the adapter panel 30, thereby providing an exposed and accessible mounting surface for additional feature components and/or modules, such as the device detection feature 14, power insertion feature 16 and data management feature 20. The additional feature components and/or modules can be disposed directly upon the printed circuit board 40, or electrically coupled as modules, including DIMM or similar devices (not shown), parallel modular printed circuit boards as shown in FIG. 5, or perpendicular modular printed circuit boards as in FIG. 6. In FIG. 5, an additional feature, or additional functionality option board 48 is shown mounted parallel to the surface of the patch panel printed circuit board 40, and in FIG. 6, an additional feature printed circuit board 50 is shown mounted perpendicular to the patch panel printed circuit board 40, each using direct modular or flexible connections 45 to electrically couple each printed circuit board 40, 48 and 50.

A number of coupling devices, such as patch port assemblies 44, can also be positioned on the surface of the printed circuit board 40 to interface with various cabling routed along the front surface of the adapter panel. The coupling devices, shown extending between the surface of the printed circuit board 40 and the front surface of the adapter panel 30 via port apertures 32, can be used to terminate cabling routed through the cable management mechanisms 34 without requiring direct access to the printed circuit boards 40, 48 or 50, and provide the electrical circuit between an insulation displacement connector (IDC) and a modular RJ45 connector as described in greater detail below.

Returning to FIG. 4, the printed circuit board 40 can accommodate the required electronic circuitry 46 for the advanced feature circuits directly on the surface area of the patch panel printed circuit board 40, or as shown in FIGS. 5 and 6, the advanced feature components can be modular and coupled with the printed circuit board 40 in any number of combinations. These advanced feature circuits of FIGS. 4 through 6, components 46, 48, and 50 respectively, can include the device detection, power insertion, and management features of FIG. 1, in addition to any number of additional advanced features available. Each advanced feature circuit can be added, upgraded, removed, or replaced according to the desired level of functionality desired without replacing the entire patch panel 12 or patch panel printed circuit board 40 and incurring additional rewiring costs. For example, as noted above, separate modules can be used for providing different functions, such as power application and asset management functions.

Although the advanced feature circuits of the printed circuit board 40 are shown positioned opposite the patch port assemblies 44 in FIGS. 4 through 6, in yet another embodiment of the present invention, the advanced feature circuits of the printed circuit board 40 can be positioned on the same side as the patch port assemblies 44, and can further extend through additional openings to the front surface of the adapter panel 30 as shown and described in greater detail below in reference to FIG. 12. A face or cover can then be provided to open and close to allow access to the advanced feature circuits (e.g., electronic modules) for service, upgrades and replacement.

Once assembled, the patch panel printed circuit board 40 can be used to provide a communication circuit between, for example, an insulation displacement connector at a PD/User end, and any standard interface type using unshielded twisted pair cables, such as an RJ45 connector at a switch end. As constructed, the present invention can include a 3U panel which has space for cable management and active circuitry between telecommunication circuits that are arranged above and below the cable management and active circuitry, and including 1 to 120 ports per unit such that density is maintained.

As known to those skilled in the art, the required electronic circuitry for the advanced feature circuits 46, 48 and 50, typically includes a certain amount of active circuitry. Where these circuits are provided as plug-in modules (e.g., DIMM or similar devices) or positioned on the printed circuit board 40, a degree of patch panel performance degradation can be created due to the active circuitry elements involved. The printed circuit board 40 of the present invention however, is configured to compensate for this degradation and provide category 3, 5, 5e, 6 and/or higher (e.g. 6or 7) and equivalent performance levels as required. Specifically, the present invention includes a patch panel circuit having a number of techniques to significantly minimize the impact of such performance degradation.

Figure 7:
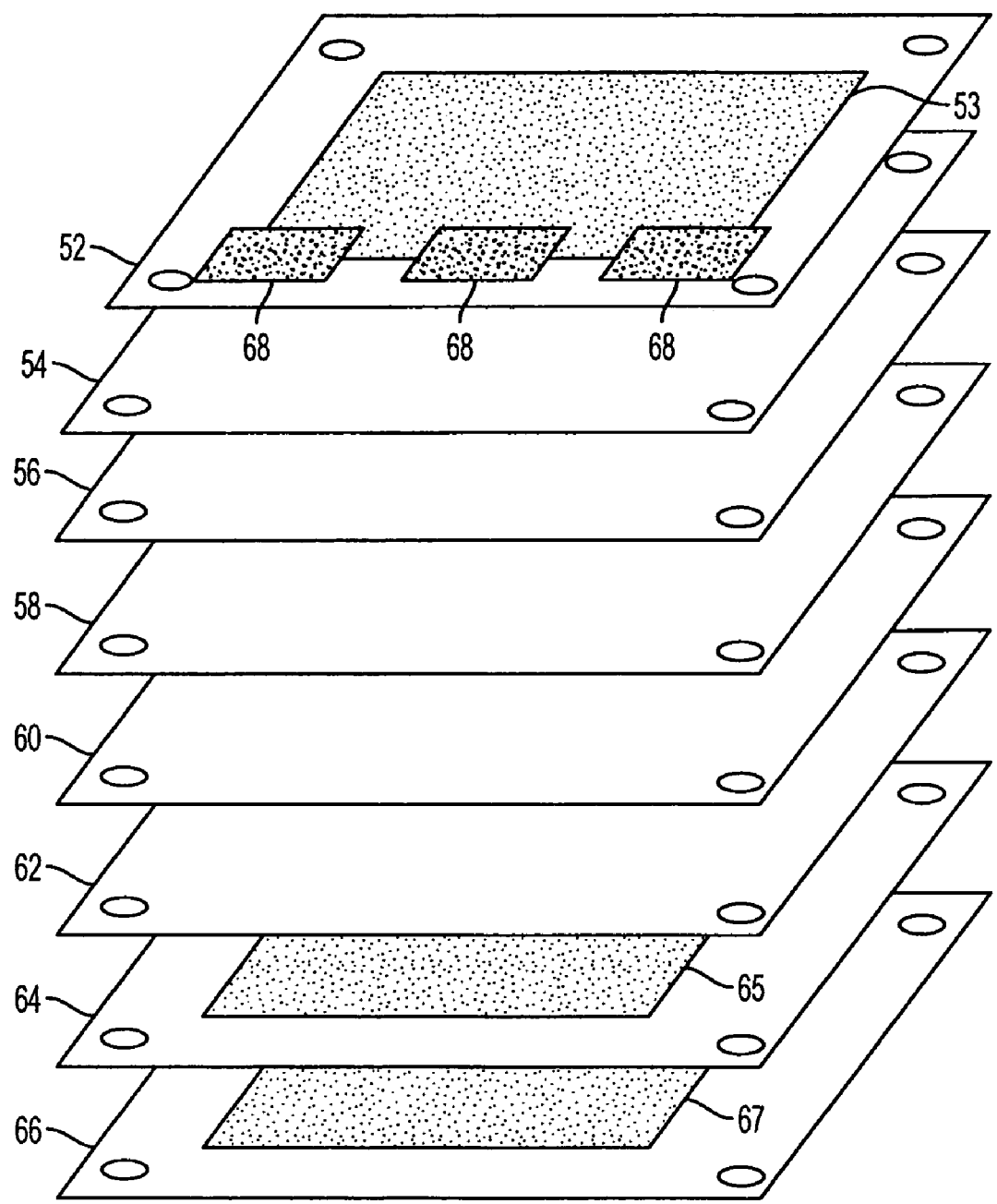
FIG. 7 is a plan view of a layered patch panel printed circuit board in accordance with an embodiment of the present invention.

A first compensation technique used in accordance with the present invention is achieved through patch panel printed circuit board design and layer separation. As shown in FIG. 7, the present invention constructs the printed circuit board 40 as an ordered multi-layered panel to separate the signal layers, such as the traditional telecommunication signals and the like (e.g., Ethernet signals), from the active circuits. FIG. 7 is a plan view of a layered patch panel printed circuit board assembly illustrating individual layer views of the patch panel printed circuit board 40 in accordance with the present invention.

The active circuitry of the patch panel circuit 12 typically includes any detection circuitry, operational amplifiers and other components necessary for logical operations and power insertion in the patch panel network. Additional details regarding such circuitry are disclosed in U.S. Pat. No. 5,406,260 to Cummings et al., referenced above. In the present invention, this active circuitry, including functional logic circuitry, is positioned via either plug-in modules (e.g., DIMM or similar devices), or placement directly upon one or more layers of the printed circuit board 40, which are then separated from remaining layers as described below.

In the example shown in FIG. 7, the printed circuit board panel 40 of patch panel 12 is constructed of at least 8 layers, and includes layers 52 through 66 upon which components, features and signal traces can be separated, and yet still provide an electrical circuit between an IDC and an RJ45 connector in accordance with an embodiment of the present invention. In the multi-layer patch panel of FIG. 7, the signal layers occupy the first two or more layers, beneath which are ground and power layers that provide isolation. The remaining one or more layers contain the components and routing for the active circuits which are separated from the signal, or telecommunication circuitry by placement in layers that are isolated by the ground and/or power planes. One example of the layer arrangement of the printed circuit board 40 is defined below in Table 1.

TABLE 1

| Layer | Function |
|---|---|
| 52 | Telecommunication circuit with signal carrying traces and a limited number of compensation circuitry. This layer also can include components which need to be part of, or in close proximity to the signal traces. |
| 54 | Telecommunication circuit with compensation circuitry and a limited number of signal carrying traces. |
| 56 | Ground plane. |
| 58 | Ground plane. |

TABLE 1-continued

| Layer | Function |
|---|---|
| 60 | Power plane (e.g. +8 to +15 V). |
| 62 | Power plane (e.g. +5 V). |
| 64 | Active circuit secondary routing layer. |
| 66 | Active components, IDC components, plug-in module connectors and primary routing for active circuitry. |

When combined, the layers of the printed circuit board 40 provide an electric circuit for interfacing the field wiring with the system wiring and advanced features. In doing so, the circuit participation of each layer of the printed circuit board 40 can be described as follows.

On layer 52, telecommunication circuits 53, each with signal carrying traces and compensation circuits, are used to provide communications between a user end and switch end. Also, as discussed in greater detail below in regards to a second compensation technique, a series of compensating circuit elements 68 are positioned in the span of the signal layer. Between layers 52 and 54, is a first of several prepreg layers.

Below the first prepreg layer, a routing layer 54 is included (e.g., an Ethernet signal trace layer), followed by a first of several core layers or conventional insulator sheets, and provides a telecommunication circuit with a limited number of signal carrying traces. Below the first core layer are layers 56 and 58, which are electrical ground planes separated by a second prepreg layer and followed by a second core layer. Below the second core layer is a voltage plane layer 60 and 62, which are separated by a third prepreg layer and followed by a third core layer. Below the third core layer is layer 64, including the active circuit secondary routing 65, which is followed by a fourth prepreg layer. Below the fourth prepreg layer is layer 66, including the active components 67, primary routing for active circuitry, and IDC connections.

The active circuitry of the advanced features located on, or coupled with layers 64 and 66 can result in patch panel performance degradation at the communication layer which should be corrected to provide desired performance levels. As noted, this active circuitry 65 and 67 typically includes the detection circuitry, operational amplifiers and other components necessary for the logical operations, and additional features provided such as visual connection indicating lights and power insertion circuitry as disclosed in U.S. Pat. No. 5,406,260 to Cummings et al. referenced above. The separation of layers as shown in FIG. 7 provides for performance improvements in both the communication circuits of layers 52 and 54, and in the active circuit layers 64 and 66 by eliminating the noise interaction and shielding the communication layers from the circuit elements operating on the active circuit layers.

In the present invention, the active circuit layers are separated from the communication circuit layers by multiple electrical ground layers, core layers and prepreg layers. The voltage planes, layers 60 and 62, are placed adjacent to the active circuit layers whereas electrical ground planes 56 and 58, are placed adjacent to the communication circuit layers, as typically less noise results from such ground planes. The combined layers 56, 58, 60 and 62 still further contribute to performance improvements by providing a greater separation distance between communication and active circuit layers than typically found. Additionally, as described in greater detail below in association with the second compensation technique, a number of compensating circuit elements 68 can be positioned on layers 52 and 54 to further increase the performance level of the patch panel circuit board 40 when advanced feature electronics are added or removed.

Figure 8:
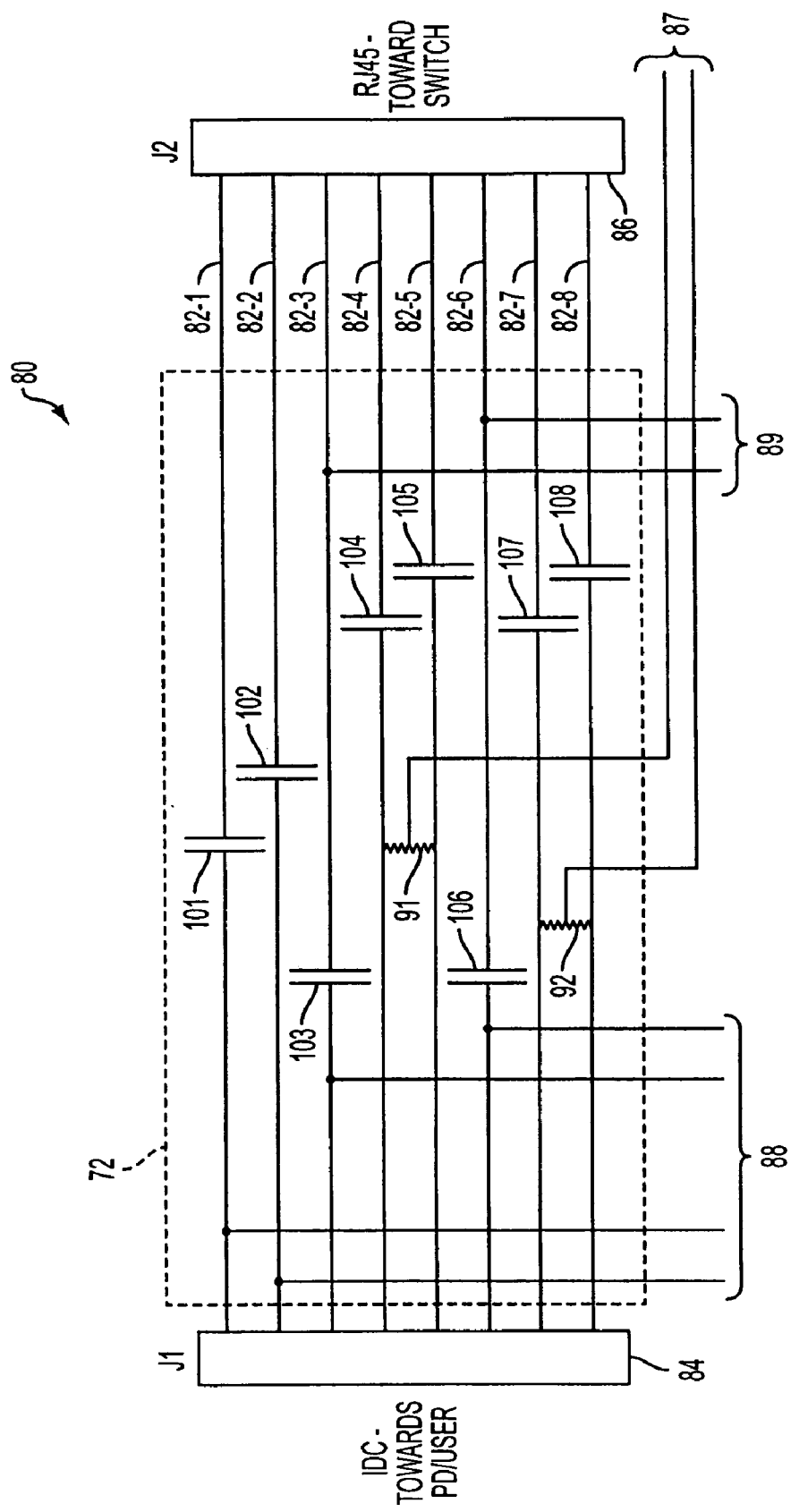
FIG. 8 is a schematic illustrating an example of active circuit elements that can be disposed on the patch panel printed circuit board for use in providing detection and power insertion in accordance with an embodiment of the present invention.
Figure 9:
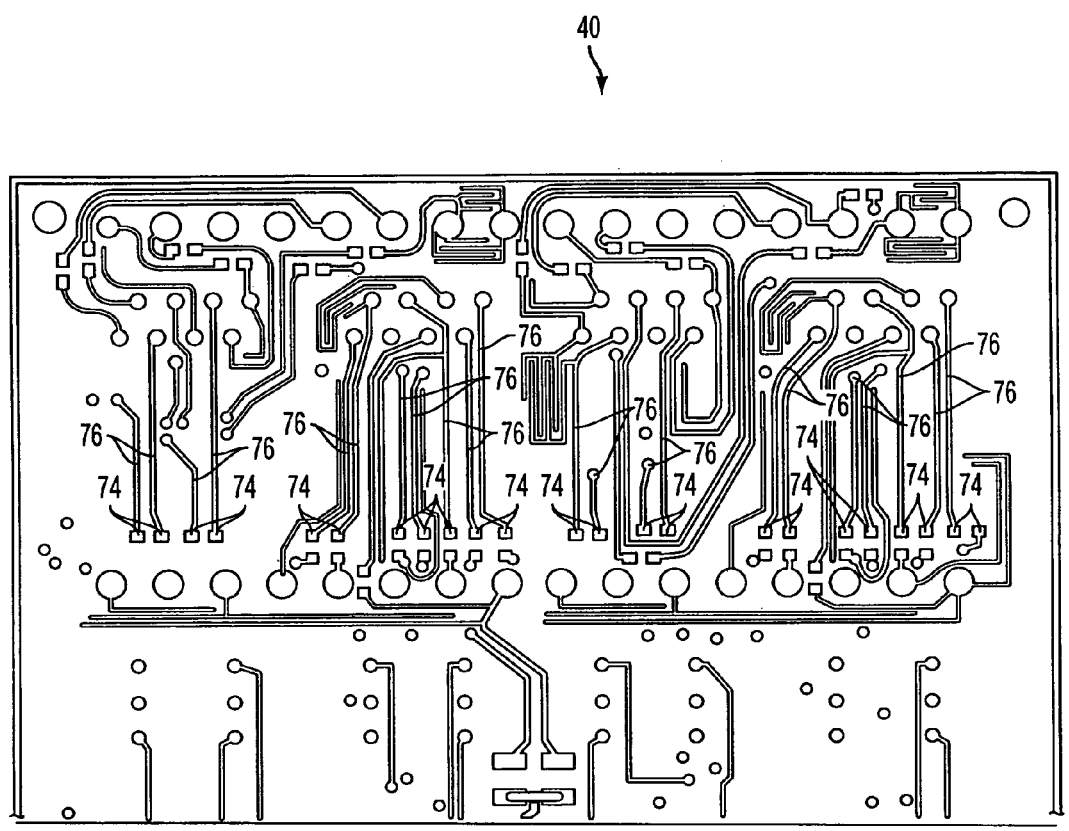
FIG. 9 is a trace layout schematic illustrating the circuit of FIG. 8 as disposed on the patch panel printed circuit board in accordance with an embodiment of the present invention.
Figure 10:
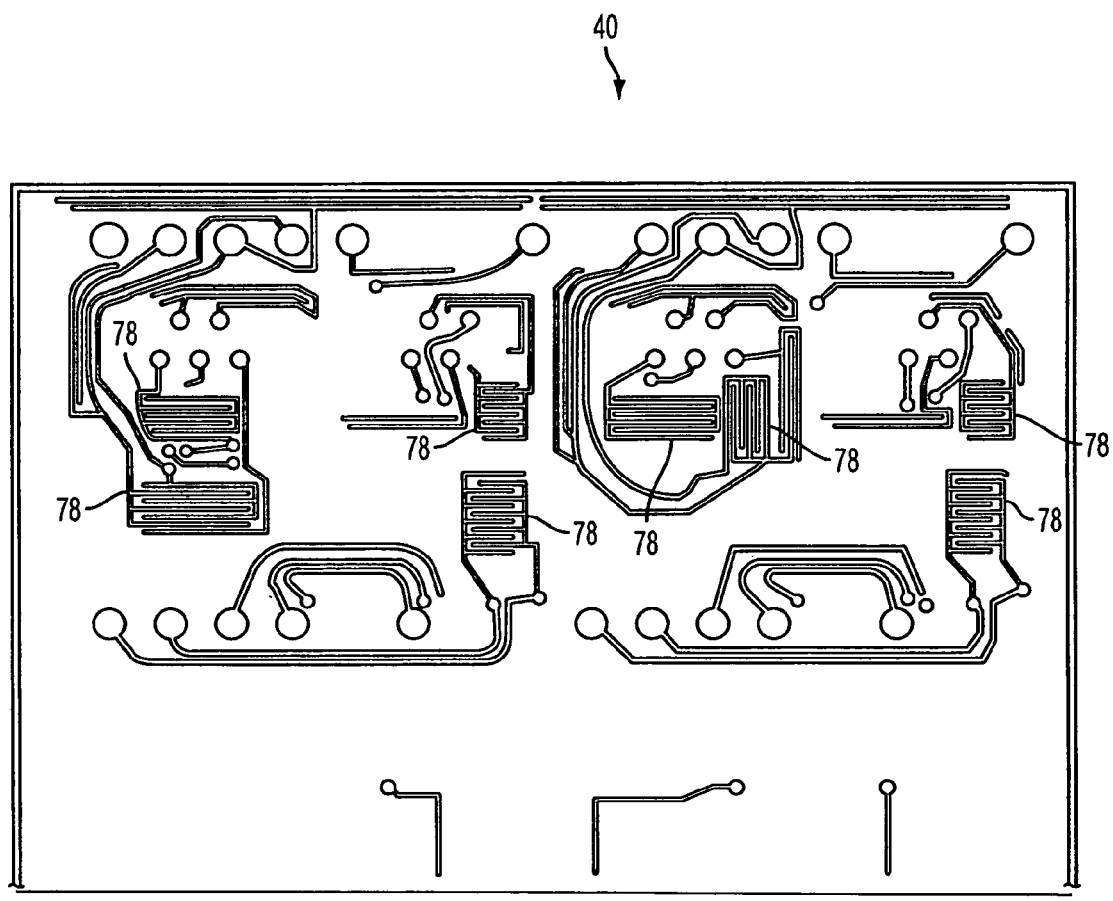
FIG. 10 is a trace layout schematic illustrating an effect minimizing circuit as disposed on the patch panel printed circuit board for use with the circuit of FIG. 8 in accordance with an embodiment of the present invention.
Figure 11:
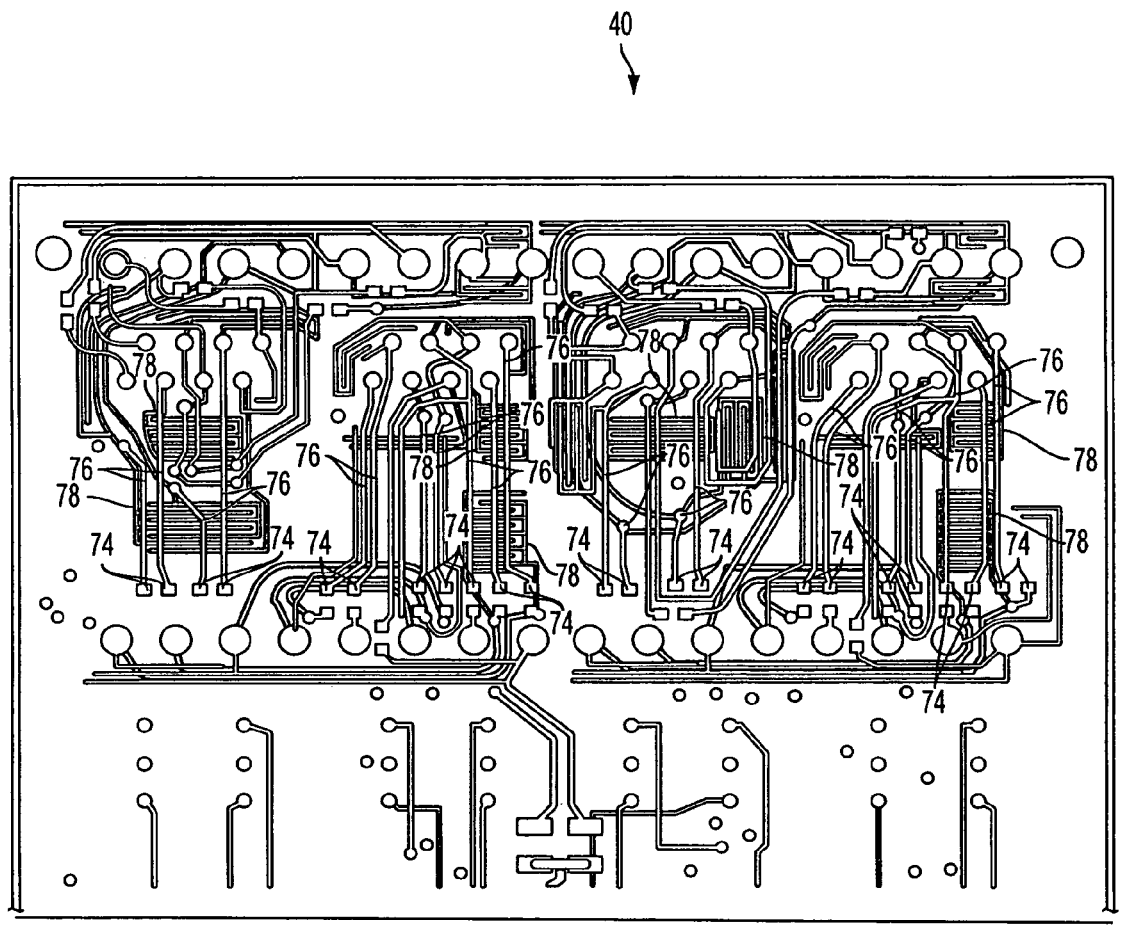
FIG. 11 is a trace layout schematic illustrating both the effect minimizing circuit of FIG. 10 and the circuit of FIG. 9 in an example position on the patch panel printed circuit board in accordance with an embodiment of the present invention.

A second compensation technique used in accordance with the present invention is achieved by providing compensating circuit elements on the patch panel printed circuit board. The compensating circuit elements of the printed circuit board 40 of the present invention are more clearly shown in FIGS. 10 and 11, and function in relation to the additional circuit elements as shown in FIGS. 8, 9 and 11. FIG. 8 is a schematic 80 illustrating an example of additional feature components such as those provided to divide the communication circuit into separate input and output circuits on the signal layer for insertion of device detection and power features. FIG. 9 is a layout schematic illustrating the circuit of FIG. 8 on the patch panel printed circuit board, and FIG. 10 is a layout schematic illustrating the compensating circuit elements for use with the circuit of FIG. 8 in accordance with an embodiment of the present invention. FIG. 11 is a layout schematic illustrating both the compensating circuit elements of FIG. 10 and the circuit of FIG. 9 in an example position on the patch panel printed circuit board 40 in accordance with the second compensation technique.

In FIG. 8, a schematic 80 is shown illustrating a partial electrical schematic of the patch panel printed circuit board 40 including several components for use with providing additional features. In addition, coupling points to advanced feature electronics are also shown. As shown in FIG. 8, schematic 80 of the patch panel printed circuit board 40 includes a number of fixed active components, signal routes, and bridging circuits 72 which can be used for signal routing and coupling points for any number of advanced feature components which provide device detection and power insertion at the patch panel via the multi-conductor link between devices and the network system. An example of one multi-conductor link between devices and the network system provided by the patch panel circuit board 40 includes a plurality of transmit and receive communication lines or signal traces, such as lines 82-1 through 82-8, for communicating information between devices, such as the devices 22(a) through 22(d) of FIG. 1 and a server or switch.

In the example shown in FIG. 8, the communication lines 82-1 through 82-8 can be routed through the patch panel along the first and second layers 52 and 54 of the patch panel printed circuit board 40 and terminate at an IDC at a PD/User end 84, and any standard interface type using twisted pair cables, such as an RJ45 connector at a switch end 86. The twisted pair cables commonly consist of unshielded twisted pair (UTP), shielded (STP), and variations of STP known as screened twisted pair (ScTP) and foil twisted pair (FTP). The RJ45 connector becomes independent from the IDC contacts due to a series of DC blocking capacitors described in greater detail below. The RJ45 dc loop represents a switch/server/active network equipment side, while the IDC dc loop represents a terminal equipment/power device side.

Where components providing advanced features are located on the printed circuit board 40, the components would comprise part of the active circuitry located on layers 64 and 66 of the multilayer printed circuit board 40. As shown in FIG. 8, the advanced feature components can be coupled with the signal traces, therefore several circuit components bridge the communication and active circuitry layers.

In FIG. 8, a power insertion module (e.g., DIMM or similar device) or electronics (not shown) can be coupled with leads 87 of schematic 80 and in doing so, power can be inserted onto the differential transmission link pairs 82-4 and 82-5, and pairs 82-7 and 82-8. The remote power can be inserted using center-tapped transformers 91 and 92 respectively, connected between two pins of each conductor pair and provide DC power to the remote devices coupled to the transmission link. The signal flow in each pair however, is not interrupted by such power insertion which allows the operation of applications that require all four conductor pairs, such as gigabit Ethernet.

Functional logic provided by a detection module (e.g., DIMM or similar device) or electronics (not shown) can also be coupled with leads 88 of the circuit and the multi-conductor link. Both the detection performed on conductor pairs and power insertion are implemented through techniques such as those defined in IEEE802.3af and TIA-568B, including updates, such as TIA-568B.1-6. In this manner, detection can be achieved by the detection module or electronics, such as when detecting the presence and removal of any device from the network via a current loop continuity circuit through conductor pairs. Using conductors 82-1, 82-2, 82-3 and 82-4, the detection module can establish the existence of a device at the end of the cabling plant and the use of these conductor pairs allows the detection of devices that utilize only these pairs, which are typically referred to as the "signal pairs" in 10 Base-T and 100 Base-T applications.

As shown in FIG. 8, a number of fixed active components, signal routes, and bridging circuits 72 are used for routing and coupling points for the advanced feature components described above. Where such advanced feature modules or electronics are coupled with the circuit, the electrical characteristics and performance of the communication circuitry will typically be reduced. The performance degradation can be minimized through design and layering using the first compensation technique described above, however, the performance degradation can also be minimized through compensating circuit elements using the second compensation technique described in greater detail below.

Therefore, the second compensation technique used in accordance with an embodiment of the present invention includes providing a series of compensating circuit elements, and positioning each on the printed circuit board 40 relative to the advanced feature active circuit electronics described above. As shown in FIG. 8, the active circuit 72 includes center-tapped transformers 91 and 92, and a series of DC blocking capacitors 101 through 108 placed on the patch panel printed circuit board in the span of the signal layer to divide the circuit into separate input and output segments. The blocking capacitors are used to block the DC signal and separate the terminal, or device side from the server side. The use of the blocking capacitors allows the delivery of DC power to only the terminal side without delivering power to the server side. In doing so, the circuit provides separate DC-loops for the cable termination section of the panel and the modular plug connections. As a result, no DC continuity can be obtained between the IDC and RJ45 terminations, however, AC and RF continuity is still maintained.

The selection of the proper blocking capacitor size is important to ensure a minimal impact on the performance of the communication circuitry. An example of capacitor values found in the circuit are defined below in Table 2.

TABLE 2

| Pin | Capacitor Value | Minimum Value | Maximum Value |
| --- | --- | --- | --- |
| 82-1 | 0.1 µF | 0.02 | 0.5 |
| 82-2 | 0.1 µF | 0.02 | 0.5 |
| 82-3 | 0.027 µF | 0.01 | 0.1 |
| 82-4 | 0.1 µF | 0.02 | 0.5 |
| 82-5 | 0.1 µF | 0.02 | 0.5 |
| 82-6 | 0.027 µF | 0.01 | 0.1 |
| 82-7 | 0.1 µF | 0.02 | 0.5 |
| 82-8 | 0.1 µF | 0.02 | 0.5 |

The active circuit elements 72 of the printed circuit board 40 also includes center-tapped transformers 91 and 92 which form a DC insertion path into the communication circuitry. These transformers bridge the active and communication circuits and allow DC current to pass, but do not affect the higher frequency performance of the differential signals that are typically operating over the same conductor pairs. As with capacitors 101 through 108, transformers 91 and 92 are also selected and placed on the patch panel printed circuit board to ensure a minimal impact on the performance level of the patch panel circuit board 40.

However, regardless of selection, the active circuitry 72 of the advanced features located on layers 64 and 66 can still result in patch panel performance degradation at the communication layer. To minimize these effects, a series of compensating circuit elements are positioned in the span of the signal layer and a degree of inductive coupling is also provided on the signal layer. As more clearly shown in FIGS. 8 and 9, the active circuitry 72 is disposed on layers 64 and 66 of the patch panel printed circuit board 40 and is comprised in part of capacitors 101 through 108 positioned at points labeled 74. FIG. 9 illustrates at least one layer of a portion of a patch panel printed circuit board layer surface, upon which the capacitors 101 through 108 are provided in series with the circuit traces extending on layers 64 and 66 and shown labeled 76. The placements shown in FIG. 9 are presented as one example only, and further placement can be provided in yet other versions of the present invention as required by the application.

In FIG. 10, a series of compensating circuit elements are shown positioned in the span of the signal layers 52 and 54 of the patch panel printed circuit board 40. FIG. 10 illustrates at least another layer of a portion of a patch panel printed circuit board layer surface, upon which the compensating circuit elements are provided, shown at points labeled 78. These compensating circuit elements include inductive, capacitive and reactive elements which serve to compensate for the adverse effects of the active circuit elements disposed on layers 64 and 66. As known to those skilled in the art, printed circuit board traces are typically constructed of foil or copper-clad foil materials and establish capacitance and inductive coupling with adjacent traces on the same or different layers. Typically, such traces are provided with gaps of approximately three times the trace width to minimize this capacitance and inductive coupling, however the beneficial use of such parasitic effects can be achieved through alternate placements. In the example shown in FIG. 10, the compensating circuit elements are constructed as interdigital comb traces on at least one layer of the printed circuit board 40, however, each (i.e., inductive, capacitive and reactive elements) can be provided on any layer as required. For example, inductive coupling is provided on layers including signal traces.

As shown in FIG. 10, a series of such traces are provided in the compensating circuit elements shown at points labeled 78. In the example shown in FIG. 10, the series of traces are provided on the signal layers 52 and 54, and are positioned relative to the capacitors and capacitor traces shown at points labeled 74 and 76 on layers 64 and 66 of the patch panel printed circuit board. In the examples shown in FIG. 10, the positioning of the elements 68 is provided as only one example, and can be reconfigured as required given different capacitor positioning at the active circuit layer.

In FIG. 11, an example of a completed assembly in accordance with an embodiment of the present invention is shown, wherein the positioning between the capacitors and capacitor traces on layers 64 and 66 of FIG. 9, and the compensating circuit elements on the signal layers 52 and 54 of FIG. 10 is illustrated. Specifically, the compensating circuit elements on the signal layers (i.e. capacitors, or any inductive coupling or other compensation method), are positioned to couple, or compensate, between the traces of the communication circuit. This coupling/compensation restores balance (i.e. return loss and impedance), to the circuit and reduces or cancels any noise that results from the unbalance, including near end crosstalk (NEXT), far end crosstalk (FEXT), and the like. In such a configuration, the beneficial parasitic effects of the compensating circuit elements can be used to further increase the performance level of the patch panel circuit board 40 when advanced feature electronics are added.

Therefore, in addition to the printed circuit board layer separation described above, the present invention can further include the inductive, capacitive and reactive elements of the compensating circuits 68 on the patch panel printed circuit board 40 to compensate for the effect of the added advanced feature electronics 72 placed on or coupled with the board 40, and minimize effects thereof on signal paths. Remaining effects are minimized through the use of high impedance connection and blocking techniques. Specifically, the advanced feature active circuitry coupled with the present invention interfaces with the cabling which connects the hardware signal patch in two methods. First, through high impedance connections that "tap" the communication circuitry, or through "blocking", or series devices that are located within the span of the network. The high impedance connections also minimize the effect of the advanced feature electronics on the performance of the signal path. Additionally, the selection of blocking capacitor values as shown in Table 2 minimizes the effect on return loss and attenuation that the components may create.

Figure 12:
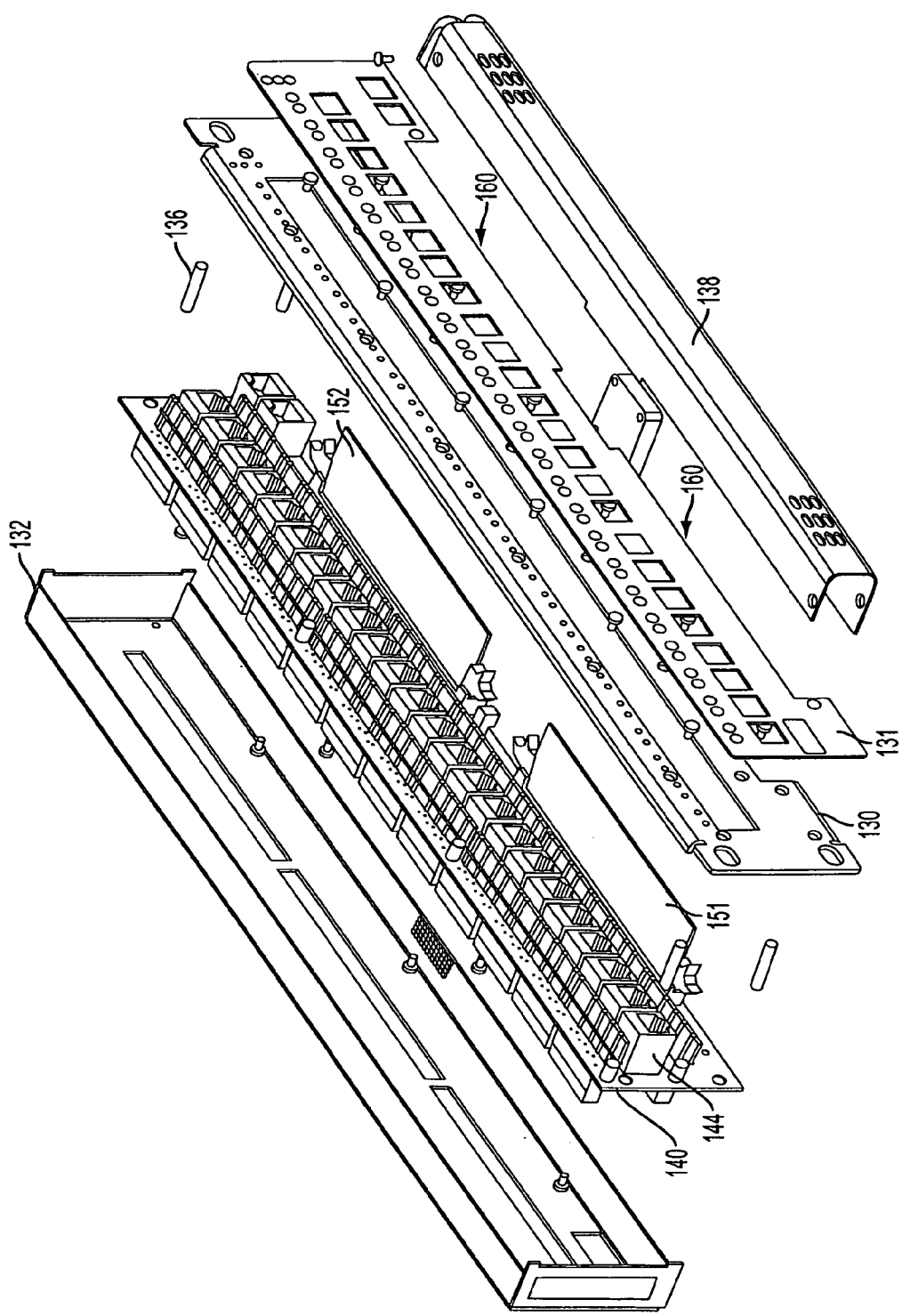
FIG. 12 is an exploded perspective view of a data terminal equipment power insertion and data collection patch panel in accordance with an embodiment of the present invention.

In yet another embodiment of the present invention shown in FIG. 12, the arrangement of the embodiments shown in FIGS. 4 through 6 can be modified. FIG. 12 is an exploded view of a data terminal equipment power insertion and data collection patch panel in accordance with another embodiment of the present invention.

As shown in FIG. 12, the patch panel includes a rear cover 132, a printed circuit board assembly 140, a plurality of patch port assemblies 144, a plurality of mounting mechanisms 136, an adapter panel 130 and overlay 131, and a cover 138. The function of each is substantially the same as those of corresponding components in FIGS. 4 through 6, accordingly, a detailed description thereof is omitted. Two separate modules, or advanced feature circuits 151 and 152, are further shown coupled with the circuit board assembly 140.

As shown in the embodiments of FIGS. 4 through 6, the advanced feature circuits of the printed circuit board 40 are positioned opposite the patch port assemblies 44. In the embodiment of the present invention shown in FIG. 12, the advanced feature circuits 151 and 152 of the printed circuit board 140 can be positioned on the same side as the patch port assemblies 144 and can extend through additional openings 160 to the front surface of the adapter panel 130. However, this is just an example of possible advanced feature circuit positioning, and still other applications of the present invention can include any number of advanced feature circuit positioning configurations, such as those incorporating 90 degree connectors (not shown).

A removable face or cover 138 can then be provided to open and close to allow access to the separate advanced feature circuits 151 and 152 (e.g., asset management, power insertion or any other desired PCB assemblies) for service, upgrades and replacement. In the exemplary embodiment shown, the easy access to the removable advanced feature circuits allows the use of off-the-shelf or custom circuits in various combinations to provide the advanced features. By providing each as separate removable modules, the embodiment can be configured and re-configured to have any of several functional options, including power insertion, asset management, both or neither. Such a configuration further allows an installation and appearance substantially the same as that of a conventional patch panel.

The present invention can be configured as a single unit with all or partial functionality, or a multiple unit including additional functionality option boards and connectors as shown in FIGS. 4 through 6. The present invention can be a single or multi-port device, including from 1 to 120 ports per unit, exceeding currently available levels of 24 to 48 ports per unit, and providing a connecting point for modular connectors. The patch panel printed circuit board is sized to occupy approximately three rack units (i.e. 3U, or approx. 3×1.75 inches) and maintain the density of the ports in the final panel as cable management can now be a part of the same patch panel. As constructed, the present invention can include a 3U panel which has space for cable management and active circuitry between telecommunication circuits that are arranged above and below the cable management and active circuitry, including a plurality of ports such that density is maintained. The present invention also provides at least one modular connector as an output, typically an RJ45 connector, which interfaces with a modular plug. The above combinations allow the construction of a patch panel including cable management and active circuitry within a 3U panel size, and specifically, the ability to obtain at least 48 ports and associated cable management in a 3U panel size.

The present invention described above provides communication hardware that is capable of at least category 3, 5, 5e, 6 and/or higher (e.g. 6e or 7) and equivalent performance levels as required, and also maintains category transmission performance as defined in IEEE802.3 and TIA-568B transmission requirements. The present invention can be hard-wired to the cabling plant and thus, can also be used to collect and provide information about the location of attached devices via a data management feature. This can be particularly important for services such as emergency 911 applications where the location of the calling party is critical to determine, especially when on a VoIP network.

While one embodiment has been chosen to illustrate the invention, it will be understood by those skilled in the art that various changes and modifications can be made therein without departing from the scope of the invention as defined in the appended claims.

What is claimed is:

1. A compensating advanced feature patch panel that can include removable modular or fixed electronic components, wherein the patch panel provides improved performance levels, said patch panel comprising:
- a multilayered patch panel printed circuit board comprising a plurality of layers;
- a communication circuit disposed on at least a first layer of said plurality and electrically coupled between an insulation displacement connector (IDC) at a PD/User end and an RJ45 connector at a telecommunication equipment end;
- at least one of a removable modular or fixed electronic component electrically coupled with said communication circuit, said component comprised of at least one active circuit disposed on at least a second layer of said plurality to provide an advanced feature; and
- a compensating separation mechanism comprised of at least a third layer of said plurality and disposed between said first and second layers to isolate said active circuit from said communication circuit and to substantially minimize at least one adverse effect resulting from said active circuit and thereby providing improved performance levels.

2. A compensating advanced feature patch panel that can include removable modular or fixed electronic components as claimed in claim 1, wherein said communication circuit includes at least one of a signal carrying trace or a telecommunication routing circuit.

3. A compensating advanced feature patch panel that can include removable modular or fixed electronic components as claimed in claim 1, wherein said advanced feature includes at least one of a device detection feature, logical operation feature and power insertion feature.

4. A compensating advanced feature patch panel that can include removable modular or fixed electronic components as claimed in claim 1, wherein said removable modular electronic component comprises at least one dual in-line memory module (DIMM).

5. A compensating advanced feature patch panel that can include removable modular or fixed electronic components as claimed in claim 4, further comprising a removable cover for covering said at least one DIMM.

6. A compensating advanced feature patch panel that can include removable modular or fixed electronic components as claimed in claim 4, wherein said multilayered patch panel printed circuit board further comprises a user accessible first side from which said at least one DIMM and said RJ45 connector are extended.

7. A compensating advanced feature patch panel that can include removable modular or fixed electronic components as claimed in claim 1, wherein said active circuit includes at least one of an active circuit secondary routing layer, active circuit component, IDC component, plug-in module connector and primary routing for active circuitry.

8. A compensating advanced feature patch panel that can include removable modular or fixed electronic components as claimed in claim 7, wherein said active circuit component includes at least one DC blocking capacitor.

9. A compensating advanced feature patch panel that can include removable modular or fixed electronic components as claimed in claim 7, wherein said active circuit component includes at least one center-tapped transformer.

10. A compensating advanced feature patch panel that can include removable modular or fixed electronic components as claimed in claim 7, wherein said active circuit component includes at least one operational amplifier.

11. A compensating advanced feature patch panel that can include removable modular or fixed electronic components as claimed in claim 1, wherein said third layer includes at least one of a core layer, prepreg layer, ground plane layer and voltage plane layer.

12. A compensating advanced feature patch panel that can include removable modular or fixed electronic components as claimed in claim 1, wherein said adverse effect includes at least one of an increased noise level, reflection, adverse inductive coupling and adverse capacitive coupling.

13. A compensating advanced feature patch panel that can include removable modular or fixed electronic components as claimed in claim 1, wherein said multilayered patch panel printed circuit board further comprises a 3U panel size having at least 48 ports.

14. A compensating advanced feature patch panel that can include removable modular or fixed electronic components as claimed in claim 1, wherein said multilayered patch panel printed circuit board further consists of a panel having at least 48 ports and at least one of a height dimension of 1U, 2U and 3U.

15. A compensating advanced feature patch panel that can include removable modular or fixed electronic components as claimed in claim 1, wherein said multilayered patch panel printed circuit board further comprises a cable management mechanism.

16. A compensating advanced feature patch panel that can include removable modular or fixed electronic components as claimed in claim 1, wherein said multilayered patch panel printed circuit board further comprises said active circuit and cable management mechanism arranged adjacent to and between said communication circuit upon a surface of said patch panel printed circuit board.

17. A compensating advanced feature patch panel that can include removable modular or fixed electronic components as claimed in claim 1, wherein said improved performance levels include at least one of a category 3, 5, 5e, 6, 6e and 7 performance levels and higher.

18. A method of making an advanced feature patch panel that can include removable modular or fixed electronic components which are separately or in combination capable of providing advanced features such as device detection and power insertion, wherein the patch panel provides improved performance levels, said method comprising the steps of:
- assembling a multilayered patch panel printed circuit board having a plurality of layers;
- disposing upon at least a first layer of said plurality a communication circuit, said communication circuit electrically coupled between an insulation displacement connector (IDC) at a PD/User end and an RJ45 connector at a telecommunication equipment end;
- disposing upon at least a second layer of said plurality at least one of a removable modular and fixed electronic component electrically coupled with said communication circuit, said component comprised of at least one active circuit for use in providing an advanced feature; and
- isolating said first layer from said second layer via a compensating separation mechanism comprised of at least a third layer of said plurality disposed between said first and second layer to isolate said active circuit from said communication circuit and substantially minimize at least one adverse effect resulting from said active circuit and thereby providing improved performance levels.

19. A method of making an advanced feature patch panel as claimed in claim 18, further comprising the step of disposing upon said first layer of said plurality a communication circuit including at least one of a signal carrying trace or a communication routing circuit.

20. A method of making an advanced feature patch panel as claimed in claim 18, further comprising the step of disposing upon said second layer of said plurality at least one of a removable modular or fixed electronic component including at least one of an active circuit secondary routing layer, active circuit component, IDC component, plug-in module connector and primary routing for active circuitry.

21. A method of making an advanced feature patch panel as claimed in claim 20, wherein said active circuit component includes at least one DC blocking capacitor.

22. A method of making an advanced feature patch panel as claimed in claim 20, wherein said active circuit component includes at least one center-tapped transformer.

23. A method of making an advanced feature patch panel as claimed in claim 20, wherein said active circuit component includes at least one operational amplifier.

24. A method of making an advanced feature patch panel as claimed in claim 18, wherein said third layer includes at least one of a core layer, prepreg layer, ground plane layer and voltage plane layer.

25. A method of making an advanced feature patch panel as claimed in claim 24, wherein said isolating said first layer from said second layer further comprises the steps of:
   positioning at least one voltage plane layer adjacent to said second layer in said multilayer patch panel printed circuit board assembly;
   positioning at least one ground plane layer adjacent to said first layer in said multi-layer patch panel printed circuit board assembly; and
   separating each said layer in said plurality by at least one of a prepreg layer and a core layer.

26. A method of making an advanced feature patch panel as claimed in claim 24, wherein said isolating said first layer from said second layer further comprises the steps of:
   positioning at least one ground plane layer adjacent to said second layer in said multilayer patch panel printed circuit board assembly;
   positioning at least one ground plane layer adjacent to said first layer in said multi-layer patch panel printed circuit board assembly; and
   separating each said layer in said plurality by at least one of a prepreg layer and a core layer.

27. A method of making an advanced feature patch panel as claimed in claim 18, wherein said adverse effect includes at least one of an increased noise level, reflection, adverse inductive coupling and adverse capacitive coupling.

28. A method of making an advanced feature patch panel as claimed in claim 18, wherein said improved performance levels include at least one of a category 3, 5, 5e, 6, 6e and 7 performance levels and higher.

* * * * *